(12) United States Patent
Lee et al.

(10) Patent No.: US 10,795,476 B2
(45) Date of Patent: Oct. 6, 2020

(54) TOUCH SENSOR AND DISPLAY DEVICE INCLUDING THE SAME

(71) Applicant: Samsung Display Co., Ltd., Yongin-si, Gyeonggi-do (KR)

(72) Inventors: Choon Hyop Lee, Yongin-si (KR); Ga Yeon Yun, Yongin-si (KR); Jeong Heon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/250,914

(22) Filed: Jan. 17, 2019

(65) Prior Publication Data

US 2019/0278409 A1 Sep. 12, 2019

(30) Foreign Application Priority Data

Mar. 6, 2018 (KR) ........................ 10-2018-0026208

(51) Int. Cl.
*G06F 3/044* (2006.01)
*G06F 3/041* (2006.01)
*H01L 27/32* (2006.01)
*H01L 51/00* (2006.01)
*G09F 9/30* (2006.01)

(52) U.S. Cl.
CPC ............ *G06F 3/0412* (2013.01); *G06F 3/044* (2013.01); *G09F 9/301* (2013.01); *H01L 27/323* (2013.01); *H01L 51/0097* (2013.01); *G06F 2203/04102* (2013.01)

(58) Field of Classification Search
CPC ...... G06F 3/044; G06F 3/0443; G06F 3/0412; G06F 3/0446; G06F 3/0448; G06F 2203/04111; G06F 2203/04102; H01L 51/0097; H01L 27/323; G09F 9/301
See application file for complete search history.

(56) References Cited

U.S. PATENT DOCUMENTS 9,547,385 B2 1/2017 Han et al.
2015/0029143 A1* 1/2015 Kang .................... G06F 1/1652
345/174

(Continued)

FOREIGN PATENT DOCUMENTS

KR 10-2015-0077819 A 7/2015

*Primary Examiner* — Towfiq Elahi
(74) *Attorney, Agent, or Firm* — Lewis Roca Rothgerber Christie LLP

(57) ABSTRACT

A touch sensor includes: a substrate having a flat area and a bent area bent from the flat area; a plurality of first sensing electrodes on the substrate and extending in a first direction; and a plurality of second sensing electrodes on the substrate and extending in a second direction crossing the first direction. The first sensing electrodes include a plurality of first sensing patterns arranged in the first direction and a plurality of first connecting patterns respectively connecting adjacent ones of first sensing patterns to each other, and the second sensing electrodes include a plurality of second sensing patterns arranged in the second direction. A first angle between a first one of the first connecting patterns in the flat area and the first direction is different from a second angle between a second one of the first connecting patterns in the bent area and the first direction.

21 Claims, 6 Drawing Sheets

(56) References Cited

U.S. PATENT DOCUMENTS

| | | | |
|---|---|---|---|
| 2016/0011689 A1* | 1/2016 | Kim | G06F 3/044 |
| | | | 345/173 |
| 2016/0170523 A1* | 6/2016 | Park | G06F 3/044 |
| | | | 345/174 |
| 2017/0344162 A1 | 11/2017 | Lee et al. | |

* cited by examiner

TOUCH SENSOR AND DISPLAY DEVICE INCLUDING THE SAME

CROSS-REFERENCE TO RELATED APPLICATION

This application claims priority to and the benefit of Korean Patent Application No. 10-2018-0026208, filed on Mar. 6, 2018 in the Korean Intellectual Property Office, the entire content of which is incorporated by reference herein.

BACKGROUND

1. Field

Aspects of embodiments of the present invention relate to a touch sensor and a display device including the touch sensor.

2. Related Art

A touch sensor is an input device for inputting a user's command by selecting instruction content displayed on a screen of an image display device or the like by a human hand or an object. The touch sensor is provided on the front face or the inside of the image display device and converts a contact position where the human hand or the object contacts (e.g., directly contacts) the touch sensor into an electrical signal. Accordingly, the instruction content selected at the contact position is transmitted to a driving circuit through a sensing pattern and a sensing line and is received as an input signal. The driving circuit is generally provided outside and separately from the sensing pattern, and the input signal is transmitted to the driving circuit through a printed circuit board (PCB) coupled to a pad unit of the touch sensor.

SUMMARY

Embodiments of the present invention provide a display device including a touch sensor having improved electrical signal transmission despite the occurrence of one or more cracks due to bending of the touch sensor.

According to an embodiment of the present invention, a touch sensor includes: a substrate having a flat area and a bent area bent from the flat area; a plurality of first sensing electrodes on the substrate and extending in a first direction; and a plurality of second sensing electrodes on the substrate and extending in a second direction crossing the first direction. The first sensing electrodes include a plurality of first sensing patterns arranged in the first direction and a plurality of first connecting patterns respectively connecting adjacent ones of first sensing patterns to each other, and the second sensing electrodes include a plurality of second sensing patterns arranged in the second direction. A first angle between a first one of the first connecting patterns in the flat area and the first direction is different from a second angle between a second one of the first connecting patterns in the bent area and the first direction.

The first sensing patterns, the first connecting patterns, and the second sensing electrodes may be on a same layer and may include a same material.

The first angle and the second angle may be acute angles, and the first angle may be less than the second angle.

The first angle may be 45 degrees, and the second angle may be greater than 45 degrees and less than 90 degrees.

The first angle and the second angle may be obtuse angles, and the first angle may be greater than the second angle.

The first angle may be 135 degrees, and the second angle may be greater than 90 degrees and less than 135 degrees.

According to another embodiment of the present invention, a display device includes: a display panel having a flat area and a bent area bent from the flat area; and a touch sensor on the display panel and having a shape corresponding to the display panel. The touch sensor includes a plurality of first sensing electrodes extending in a first direction and a plurality of second sensing electrodes extending in a second direction crossing the first direction. The first sensing electrodes include a plurality of first sensing patterns arranged in the first direction and a plurality of first connecting patterns respectively connecting adjacent ones of the first sensing patterns to each other, and the second sensing electrodes include a plurality of second sensing patterns arranged in the second direction. A first angle between a first one of the first connecting patterns in the flat area and the first direction is different from a second angle between a second one of the first connecting patterns in the bent area and the first direction.

The first sensing patterns, the first connecting patterns, and the second sensing electrodes may be on a same layer and may include a same material.

The first angle and the second angle may be acute angles, and the first angle may be less than the second angle.

The first angle may be 45 degrees, and the second angle may be greater than 45 degrees and less than 90 degrees.

The first angle and the second angle may be obtuse angles, and the first angle may be greater than the second angle.

The first angle may be 135 degrees, and the second angle may be greater than 90 degrees and less than 135 degrees.

The display device may further include a polarizing layer on the touch sensor. The polarizing layer may have an absorption axis and a transmission axis perpendicular to the absorption axis.

The absorption axis and the first connecting patterns may be parallel to each other in the flat area.

The second angle may vary according to a radius of curvature of a position where the respective one of the first connecting patterns is arranged.

According to another embodiment of the present invention, a display device includes: a display panel having a flat area and a bent area bent from the flat area about a bending axis; a touch sensor on the display panel; and a polarizing layer on the touch sensor. The polarizing layer has an absorption axis and a transmission axis perpendicular to the absorption axis. The touch sensor includes a plurality of first sensing electrodes extending in a first direction and a plurality of second sensing electrodes extending in a second direction crossing the first direction. The first sensing electrodes include a plurality of first sensing patterns arranged in the first direction and a plurality of first connecting patterns respectively connecting adjacent ones of the first sensing patterns to each other, and the second sensing electrodes include a plurality of second sensing patterns arranged in the second direction. A first angle between a first one of the first connecting patterns in the flat area and the absorption axis is different from a second angle between a second one of the first connecting patterns in the bent area and the absorption axis.

The first sensing patterns, the first connecting patterns, and the second sensing electrodes may be on the same layer and may include the same material.

The first angle and the second angle may be less than 90 degrees, and the first angle may be less than the second angle.

The first angle may be 0 degrees, and the second angle may be greater than 0 degrees and less than 45 degrees.

An angle between the first one of the first connecting patterns in the flat area and the bending axis may be greater than an angle between the second one of the first connecting patterns in the bent area and the bending axis.

The second angle may vary according to a radius of curvature of a position where the respective one of the first connecting patterns is arranged.

DETAILED DESCRIPTION

Figure 1:
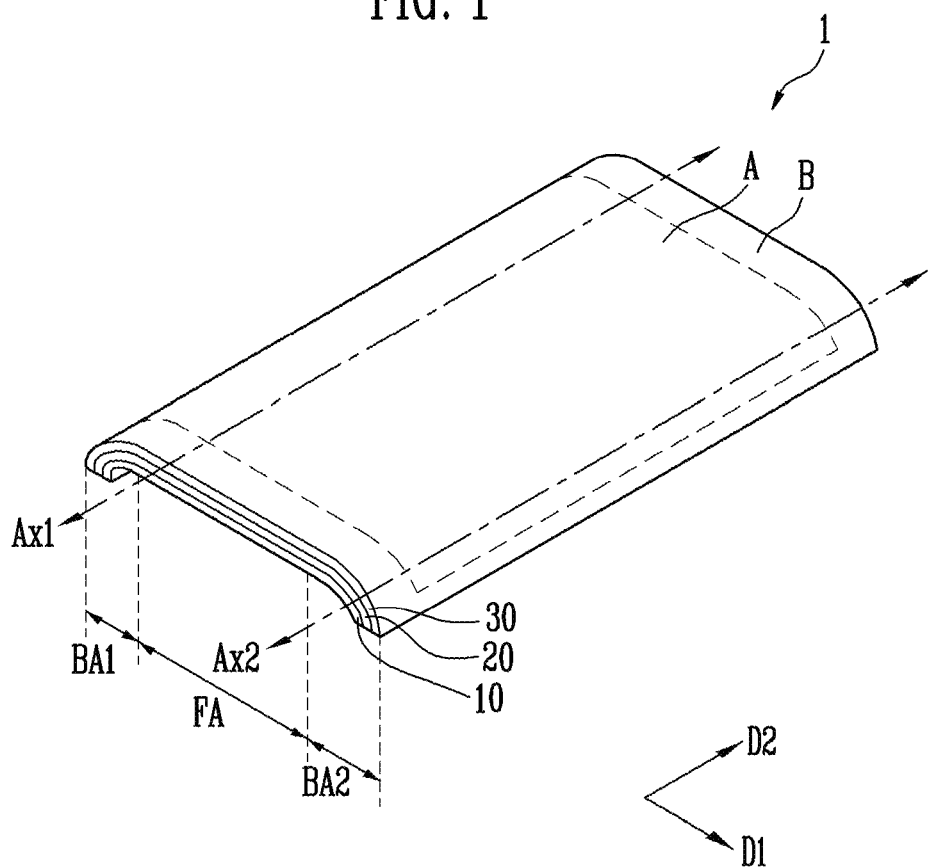
FIG. 1 is a perspective view of a display device according to an embodiment of the present invention.

While the present invention may be variously modified and may have various forms, specific example embodiments are illustrated in the figures and described, in detail, in the detailed description. It should be understood that the present invention is not intended to be limited to the particular example embodiments disclosed herein but is intended to include all modifications, equivalents, and alternatives within the spirit and scope of the present invention.

Same reference numbers are used to indicate similar components in describing each drawing. In the accompanying drawings, the dimensions of the structures may be enlarged for clarity.

Although the terms first, second, and the like may be used to describe various components, the components should not be limited by these terms. These terms are used to distinguish one component from another. For example, a first component may be referred to as a second component without departing from the scope of the present invention, and similarly, a second component may be referred to as a first component. The singular form includes plural forms unless the context clearly dictates otherwise. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the term "substantially," "about," and similar terms are used as terms of approximation and not as terms of degree, and are intended to account for the inherent variations in measured or calculated values that would be recognized by those of ordinary skill in the art.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein.

Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

It should be understood that the terms "comprise," "include," "have," and the like are intended to specify the presence of the stated features, numbers, steps, operations, components, parts, or combinations thereof but do not preclude the possibility of the presence or addition of one or more other features, numbers, steps, operations, components, parts, or combinations thereof. Also, when a portion of a layer, a film, an area, a plate, or the like is "on" another portion, this includes not only a case where it is "directly on" another portion but also a case where another portion is between the portions. When a portion of a layer, a film, an area, a plate, or the like is "under" another portion, this includes not only a case where it is "directly under" another portion but also a case where another portion is between the portions. Also, in this specification, when a portion of a layer, a film, an area, a plate, or the like is formed, stacked, or arranged on another portion, the forming, stacking, or arranging direction is not limited to an upper direction but includes a side and/or a lower direction.

Hereinafter, exemplary embodiments of the present invention will be described in more detail with reference to the accompanying drawings.

FIG. 1 is a perspective view of a display device 1 according to an embodiment of the present invention.

The display device 1 includes a first bent area BA1 bent about a first bending axis Ax1 parallel to a second direction D2, a second bent area BA2 bent about a second bending axis Ax2 parallel to the second direction D2, and a flat area FA. The second direction D2 is perpendicular to a first direction D1. The display device 1 may be divided into the first bent area BA1, the flat area FA, and the second bent area BA2 sequentially along the first direction D1 (e.g., the first bent area BA1, the flat area FA, and the second bent area BA2 may be adjacent each other in the first direction D1).

The display device 1 may be a curved display device that maintains a curved state (e.g., the display device 1 may be fixed in a curved state). Stress due to bending occurs at the first bent area BA1 and the second bent area BA2, and stress does not occur (or does not substantially occur) at the flat area FA because the flat area FA is not bent. In other embodiments, the display device 1 may be a curved display device including the first and second bent areas BA1 and BA2 bent about one bending axis without the flat area FA therebetween (e.g., the display device 1 may be continuously bent).

In some embodiments, the display device 1 may be a flexible display device having an unfolded (or flat) state and a folded state.

The display device 1 includes a display panel 10, a touch sensor 20, and a polarizing layer 30. The touch sensor 20 may be disposed on the display panel 10, and the polarizing layer 30 may be disposed on the touch sensor 20. However, in other embodiments, the polarizing layer 30 may be disposed between the display panel 10 and the touch sensor 20.

The display device 1 may be divided into an active area A and an inactive area B. The active area A may be an area where an image is displayed by the display panel 10 and/or where the touch sensor 20 is active. The active area A may be an area where a display area of the display panel 10 displays an image and a sensing area where the touch sensor 20 overlaps the display area. Accordingly, a user may input a touch signal to the display device 1 and may receive information through the displayed image concurrently (or at the same time).

The inactive area B is an area where the display panel 10 does not display an image and/or the touch sensor 20 is inactive. The inactive area B may be an area where a wiring or the like, through which an electrical signal for activating the active area A is transmitted, is disposed.

Figure 2:
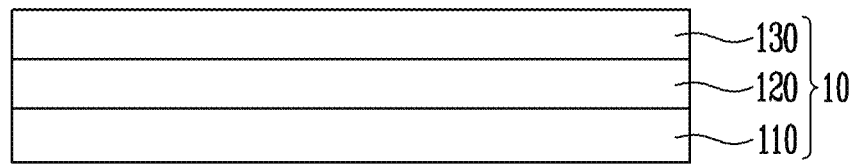
FIG. 2 is a cross-sectional view of a display panel shown in FIG. 1.

FIG. 2 is a cross-sectional view of the display panel 10 shown in FIG. 1.

The display panel 10 displays an image corresponding to input image data. The display panel 10 may be an organic light emitting display panel, an electrophoretic display panel, an electrowetting display panel, a liquid crystal display panel, or the like but is not limited thereto. Hereinafter, the display panel 10 is exemplarily described as an organic light emitting display panel.

The display panel 10 may include a base substrate 110, a pixel layer 120, and an encapsulating layer 130.

The base substrate 110 may include (or may be formed of) a flexible material, for example, a film and/or a plastic material including a polymer organic material. For example, the flexible material may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP) but is not limited thereto.

The base substrate 110 may include (or may be formed of) a rigid material, for example, glass, quartz, glass ceramic, and/or crystalline glass, but is not limited thereto.

The pixel layer 120 may be disposed between the base substrate 110 and the encapsulating layer 130. The pixel layer 120 may include organic light emitting devices and driving devices for driving the organic light emitting devices. The driving devices may include thin film transistors and various wirings. The organic light emitting devices may include an anode, an organic light emitting layer, and a cathode. Holes and electrons are injected into the organic light emitting layer from the anode and the cathode, respectively. In the organic light emitting layer, holes and electrons are combined to form excitons, and the excitons emit light as they transition from an excited state to a ground state.

The encapsulating layer 130 may be disposed on the pixel layer 120. The encapsulating layer 130 may protect the organic light emitting devices included in the pixel layer 120 from external moisture and air.

The encapsulating layer 130 may be a film in which an organic film and an inorganic film are laminated, but it is not limited thereto. For example, the encapsulating layer 130 may be a substrate including (or made of) glass and/or plastic.

Figure 3:
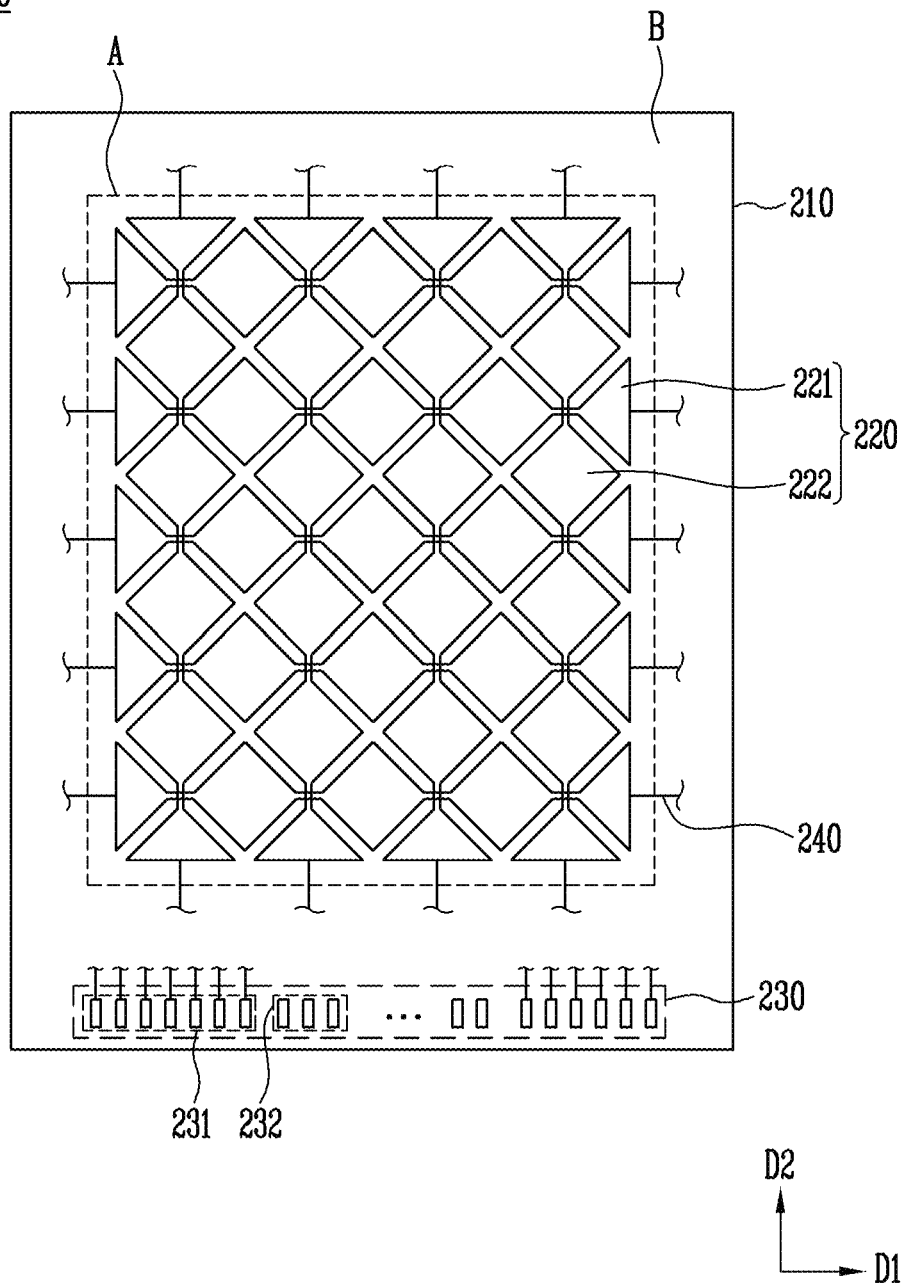
FIG. 3 is a plan view of a touch sensor according to an embodiment of the present invention.
Figure 4:
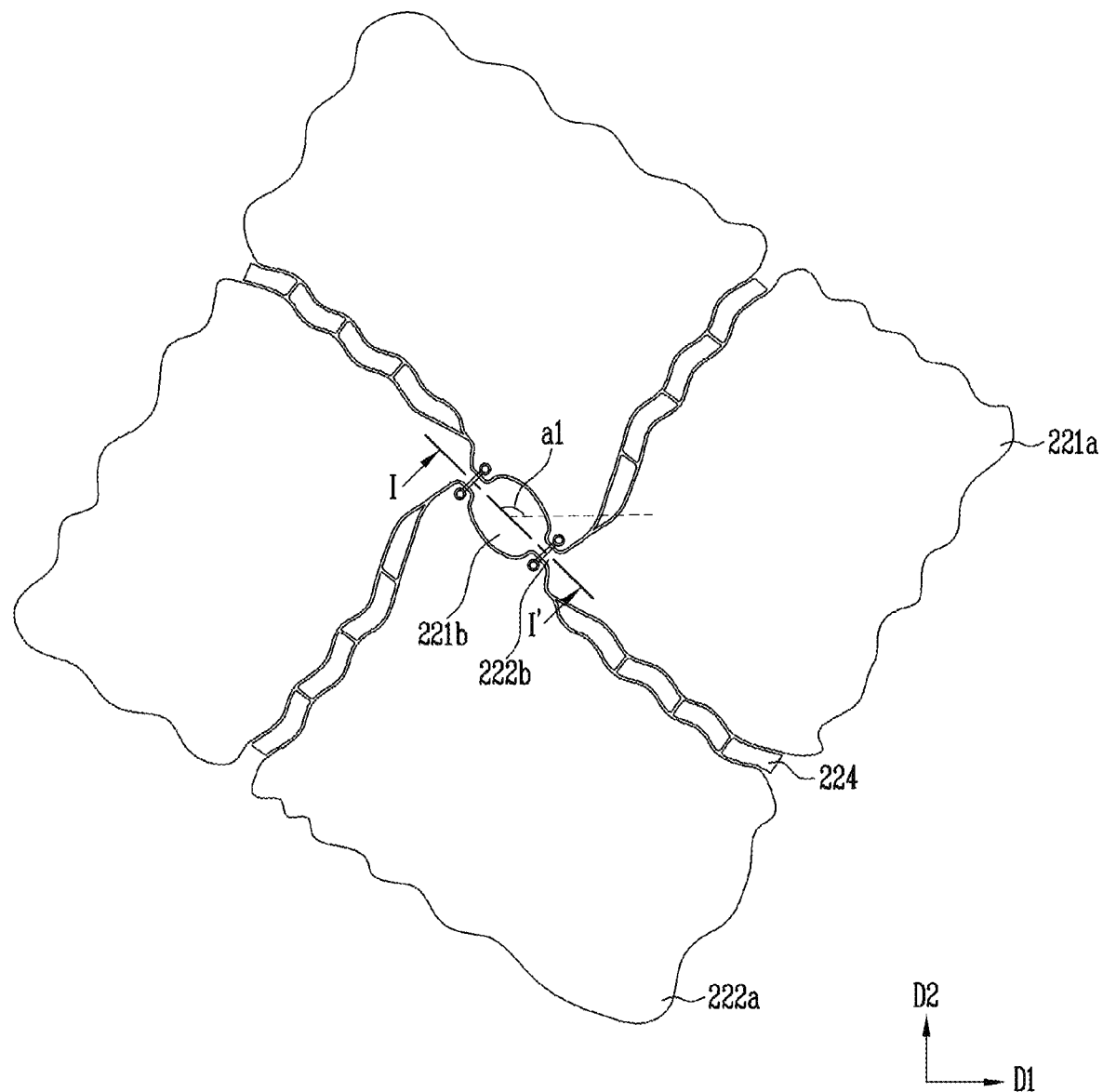
FIG. 4 is an enlarged view of sensing electrodes in a flat area of the touch sensor according to an embodiment of the present invention.
Figure 5:
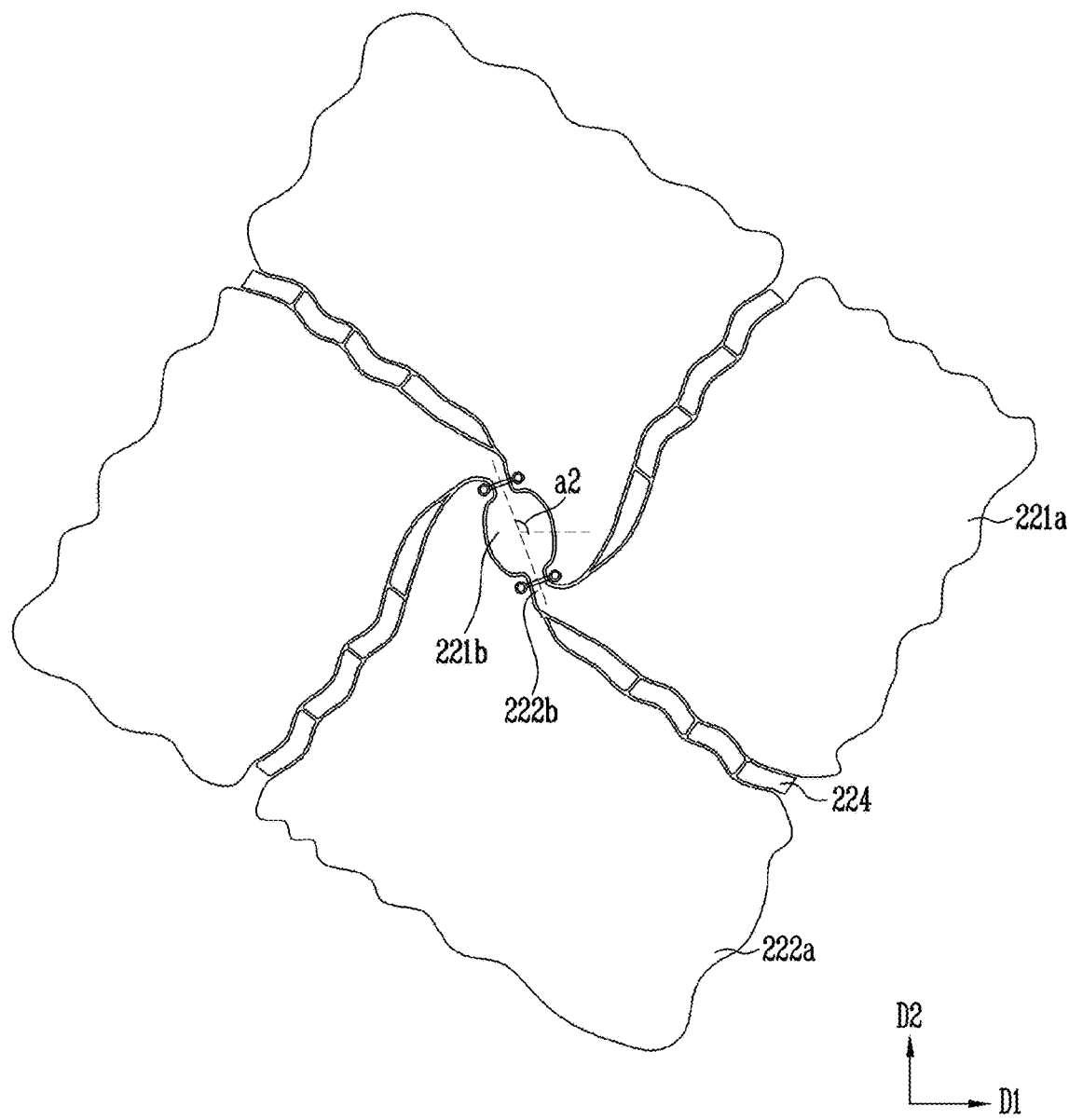
FIG. 5 is an enlarged view of sensing electrodes in a bent area of the touch sensor according to an embodiment of the present invention.
Figure 6:
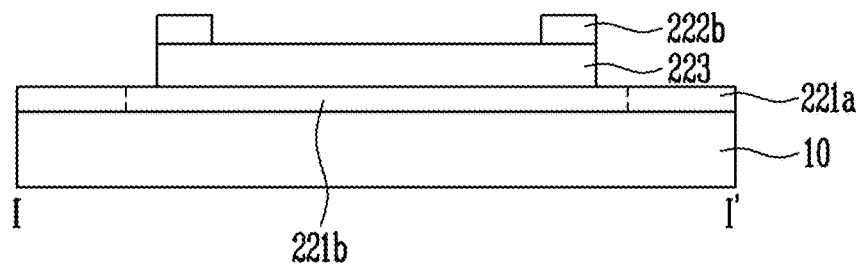
FIG. 6 is a cross-sectional view taken along the line I-I' of FIG. 4.
Figure 7:
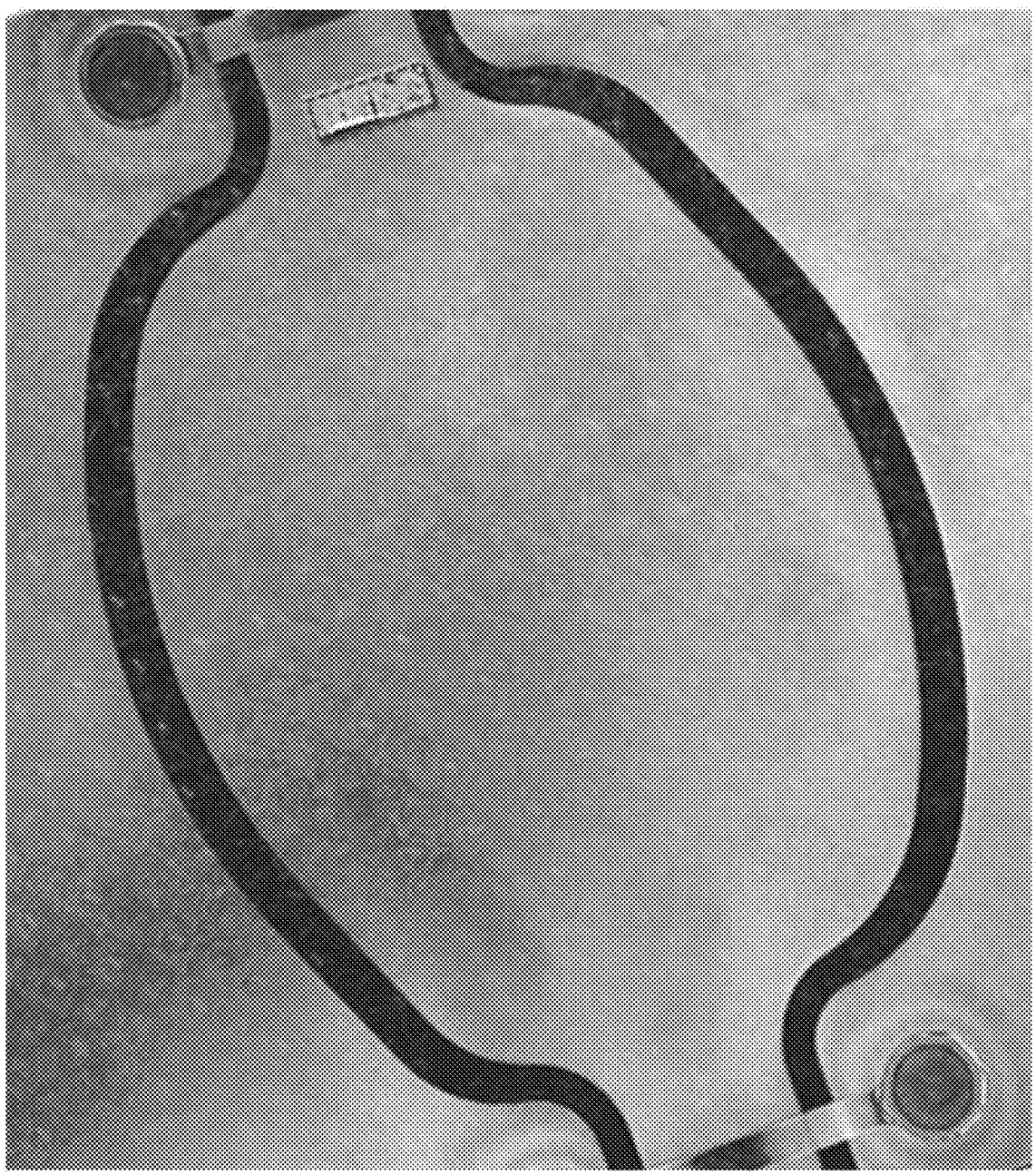
FIG. 7 is a photograph showing a crack formed on a connecting pattern of the bent area in an embodiment of the present invention.

FIG. 3 is a plan view of a touch sensor according to an embodiment of the present invention, FIGS. 4 and 5 are enlarged views of sensing patterns in the flat area and the bent area, respectively, according to an embodiment of the present invention, FIG. 6 is a cross-sectional view taken along the line I-I' of FIG. 4, and FIG. 7 is a photograph showing a crack formed on a connecting pattern of the bent area according to an embodiment of the present invention.

The touch sensor 20 may include a substrate 210, a touch input unit 220, and a pad unit 230.

The substrate 210 may include (or may be formed of) a flexible material, for example, a film and/or a plastic material including a polymer organic material. For example, the flexible material may include one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP) but is not limited thereto.

The substrate 210 may include (or may be formed of) a rigid material, for example, glass, quartz, glass ceramic, and/or crystalline glass, but is not limited thereto.

The substrate 210 prevents or reduces the occurrence of breakage of sensing electrodes 221 and 222 of the touch input unit 220 and penetration of moisture to the sensing electrodes 221 and 222.

The substrate 210 may have a flat surface and may be formed in a polygonal, circular, or oval shape. However, the shape of the substrate 210 is not limited thereto.

In some embodiments, the substrate 210 may be omitted, and in such an embodiment, the touch input unit 220 of the touch sensor 20 may be disposed on the encapsulating layer 130 of the display panel 10. In an embodiment omitting the substrate 210, the display device 1 may be more easily bent or folded because the thickness of the display device 1 is reduced.

The touch input unit 220 may be disposed on the substrate 210 at a position corresponding to the active area A of the display device 1. The touch input unit 220 may use a capacitance sensor as a position sensing method and may detect input information (e.g., input position coordinate information) by input from the surface of the substrate 210.

The touch input unit 220 may include the sensing electrodes 221 and 222 disposed on the substrate 210. The sensing electrodes 221 and 222 may include a plurality of first sensing electrodes 221 arranged in (e.g., arranged adjacent each other in) the second direction D2 and a plurality of second sensing electrodes 222 arranged in (e.g., arranged adjacent each other in) the first direction D1 crossing the second direction D2. The first direction D1 and the second direction D2 may be orthogonal to each other but are not limited thereto. The capacitances sensed through the sensing electrodes 221 and 222 vary according to inputs by, for example, the user's finger or a conductor.

The first sensing electrodes 221 may include a plurality of first sensing patterns 221a spaced apart from each other. The first sensing patterns 221a may be arranged in (e.g., arranged adjacent each other in) the first direction D1, and the first sensing patterns 221a that are adjacent to each other may be electrically connected to each other through a first connecting pattern 221b.

The second sensing electrodes 222 may include a plurality of second sensing patterns 222a. The second sensing patterns 222a may be arranged in (e.g., arranged adjacent to each other in) the second direction, and the second sensing patterns 222a that are adjacent to each other may be electrically connected to each other through the second connecting pattern 222b.

One of the first connecting pattern 221b and the second connecting pattern 222b, for example, the first connecting pattern 221b, may be provided on the same layer as the first sensing pattern 221a and the second sensing pattern 222a, for example, on the substrate 210. The other one of the first connecting pattern 221b and the second connecting pattern 222b, for example, the second connecting pattern 222b, may be provided on a different layer than the first sensing pattern 221a and the second sensing pattern 222a, for example, on an insulating layer 223. For example, the second connecting pattern 222b may be a bridge pattern. In FIGS. 4-6, an embodiment in which the first connecting pattern 221b is arranged on the same layer as the first sensing pattern 221a and the second sensing pattern 222a and the second connecting pattern 222b is arranged as a bridge pattern on the insulating layer 223 is illustrated.

As shown in FIGS. 4 and 5, the first connecting pattern 221b may be disposed such that an angle between one of the first connecting patterns 221b in the flat area and the first direction D1 is different from one of the first connecting patterns 221b in the bent area and the first direction D1.

Stress may be applied to the bent areas BA1 and BA2 when the display device 1 including the touch sensor 20 is bent during the manufacturing process. This stress may cause a crack in the touch sensor 20.

The first connecting pattern 221b disposed on the same layer as the first sensing pattern 221a has a relatively small width (e.g., a minimum width). When a crack occurs in the first connecting pattern 221b, the first connecting pattern 221b is easily disconnected due to its relatively small width (e.g., its minimum width). Thus, an electrical signal transmitted through the first sensing electrode 221 may be interrupted. Accordingly, as shown in FIG. 6, the extension direction of the first connecting pattern 221b is set to be the same as or similar to the direction of the crack such that the electric signal may be maintained even if a crack occurs on the first connecting pattern 221b.

An angle between the first connecting pattern 221b in the flat area FA and the first direction D1 is defined as a first angle a1 (see, e.g., FIG. 4), and an angle between the first connecting pattern 221b in the bent area BA and the first direction D1 is defined as a second angle a2 (see, e.g., FIG. 5). The touch sensor 20 may include the plurality of first connecting patterns 221b arranged such that the first angle a1 and the second angle a2 are different from each other.

When the first angle a1 and the second angle a2 are acute angles, the first angle a1 may be smaller than the second angle a2. When the first angle a1 and the second angle a2 are obtuse angles, the first angle a1 may be greater than the second angle a2.

An angle between the first connecting pattern 221b and the second direction D2 in one position (or area) of the flat area FA may be greater than an angle between the first connecting pattern 221b and the second direction D2 in another position (or area) of the flat area FA.

When an absorption axis of the polarizing layer 30 is about 45 degrees with respect to the first direction D1, the first angle a1 in the flat area FA may be about 45 degrees and the second angle a2 may be greater than about 45 degrees and less than about 90 degrees.

When the absorption axis of the polarizing layer 30 is about 135 degrees with respect to the first direction D1, the first angle a1 in the flat area FA may be about 135 degrees and the second angle a2 may be greater than about 90 degrees and less than about 135 degrees.

The second angle a2 may have a different value according to the radius of curvature of the position of the touch sensor where the corresponding first connecting pattern 221b is located. The second angle a2 may have two or more different values.

The sensing patterns 221a and 222a may have rhombic shapes, but they are not limited thereto and may have various, suitable shapes. The boundary of each of the sensing patterns 221a and 222a may have a zigzag shape. Accordingly, even when the display area and the sensing patterns 221a and 222a overlap each other, an influence of the sensing patterns 221a and 222a on the visibility of the displayed image may be reduced.

The first sensing patterns 221a and the second sensing patterns 222a are insulated from each other. The first sensing pattern 221a and the second sensing pattern 222a may be disposed apart from each other, and the insulating layer 223 may be disposed between the first connecting pattern 221b and the second connecting pattern 222b.

The first sensing pattern 221a, the second sensing pattern 222a, the first connecting pattern 221b, and the second connecting pattern 222b may include (or may be formed of) a material having excellent electric conductivity, for example, molybdenum, silver, aluminum, copper, palladium, gold, platinum, zinc, tin, titanium, or an alloy of two or more of these materials, but these components are not limited to these materials. In addition, the first sensing pattern 221a, the second sensing pattern 222a, the first connecting pattern 221b, and the second connecting pattern 222b may be formed using a suitable transparent electrode material known in the art, for example, indium tin oxide (ITO), indium zinc oxide (IZO), zinc oxide (ZnO), indium zinc tin oxide (IZTO), cadmium tin oxide (CTO), copper oxide (CO), poly (3,4-ethylenedioxythiophene) (PEDOT), carbon nanotube (CNT), graphene, or the like, but are not limited thereto. The first sensing pattern 221a, the second sensing pattern 222a, and the first connecting pattern 221b that are provided on the same layer may include (or may be formed by using) the same material.

The sensing electrodes 221 and 222 may further include dummy patterns 224. The dummy patterns 224 may be disposed between the first sensing electrodes 221 and the second sensing electrodes 222 on a plane. The dummy patterns 224 are disposed on the same layer as the sensing patterns 221a and 222a.

The dummy patterns 224 may be electrically floated. The dummy patterns 224 may be deposed to prevent the patterns of the sensing electrodes 221 and 222 from being visible to a user.

The pad unit 230 may be disposed at a portion of the area corresponding to the inactive area B and may include a plurality of bonding pads 231 and test pads 232. The bonding pads 231 may be connected to the sensing electrodes 221 and 222 through wirings 240.

On the substrate 210, the plurality of wirings 240 are arranged outside the touch input unit 220. One end of some of the wirings 240 is connected to the first sensing electrode 221 of the touch input unit 220, and the other end thereof is connected to a corresponding one of the bonding pads 231 of the pad unit 230. One end of the other of the wirings 240 is connected to the second sensing electrode 222 of the touch input unit 220, and the other end thereof is connected to a corresponding one of the bonding pads 231 of the pad unit 230. Information on the coordinates of the input position that the touch sensor 20 detects is output to the plurality of bonding pads 231 through the plurality of wirings 240.

The bonding pads 231 may extend in the second direction D2 and may be arranged in (e.g., arranged adjacent each other in) the first direction D1 while maintaining mutual spacing between adjacent ones of the bonding pads 231.

The test pads 232 may provide information on the degree of bonding of the PCB to the pad unit 230, information on the resistance of the bonding pads 231, information as to whether or not ACF conductive balls are in operation, and/or the like.

Figure 8:
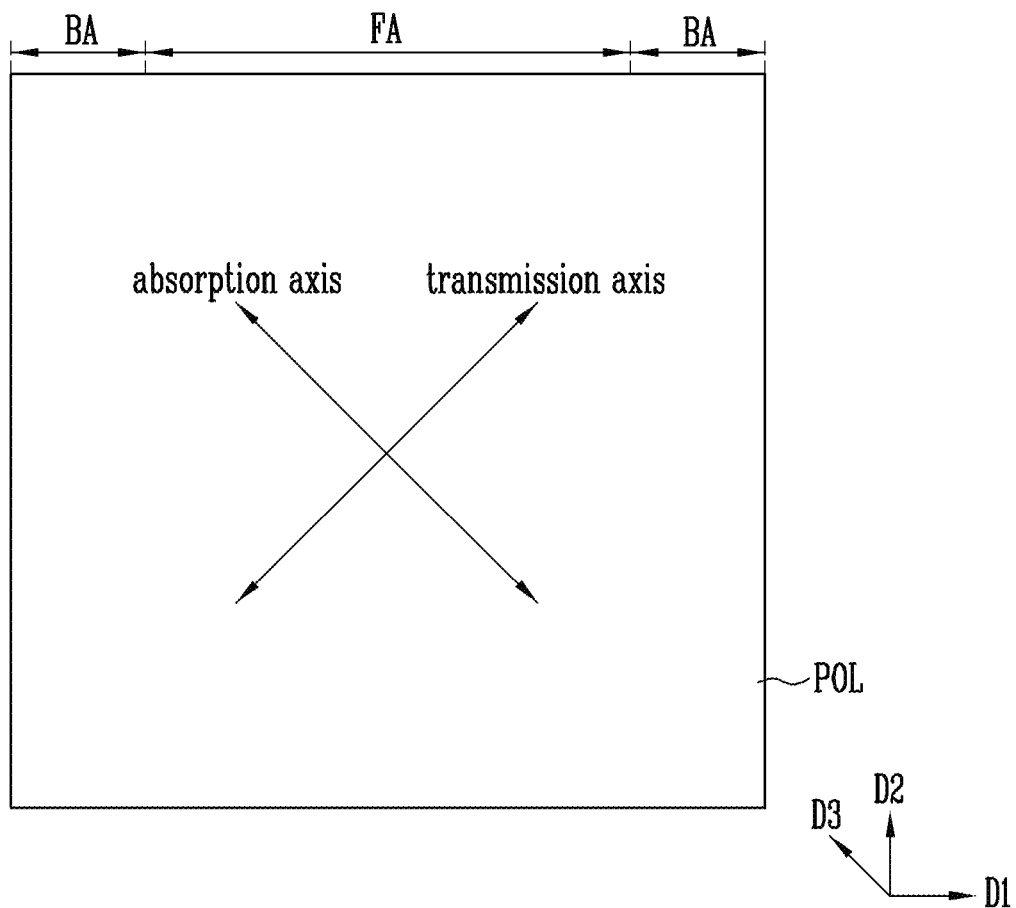
FIG. 8 is a plan view of a polarizing layer according to an embodiment of the present invention.

FIG. 8 illustrates a plan view of the polarizing layer 30 according to an embodiment of the present invention.

The polarizing layer 30 may be disposed on the upper side of the display panel 10 for an external light reflection blocking effect (e.g., the polarizing layer 30 may prevent or substantially reduce reflection of external light from the display panel 10). The polarizing layer 30 controls the amount of light emitted according to the polarization degree of the incident light.

The polarizing layer 30 includes an absorption axis and a transmission axis. The absorption axis and the transmission axis are perpendicular to each other. The polarizing layer 30 transmits light polarized parallel to the transmission axis and absorbs light polarized parallel to the absorption axis. The display color of the display panel 10 in the off state varies according to the angle between the display device 1 and the absorption axis, and the angle between the display device 1 and the absorption axis may be varied.

The absorption axis direction of the polarizing layer 30 is defined as a third direction D3. The polarizing layer 30 may be formed by stretching polymer films. The polarizing layer 30 has a strong molecular binding force in the stretching direction (e.g., an absorption axis direction). For example, when the polymer is oriented in the third direction D3, the binding force of the polymer is weaker in the transmission axis direction perpendicular to the third direction D3 than in the absorption axis direction. Accordingly, the polarizing layer 30 may be easily stretched in the transmission axis direction by heat, pressure, and/or the like.

The polarizing layer 30 may be provided such that the absorption axis of the polarizing layer 30 may be about 45 degrees or about 135 degrees with respect to the first direction D1, but it is not limited thereto.

The absorption axis in the flat area FA may be parallel or substantially parallel to the first connecting pattern 221b, and the absorption axis in the bent area BA may cross the extension direction of the first connecting pattern 221b.

An angle between the first connecting pattern 221b in the flat area FA and the absorption axis is defined as a third angle, and an angle between the first connecting pattern 221b in the bent area BA and the absorption axis is defined as a fourth angle. The touch sensor 20 may include the plurality of first connecting patterns 221b arranged such that the third angle and the fourth angle are different from each other.

When the third angle and the fourth angle are about 90 degrees or less, the third angle may be smaller than the fourth angle.

For example, when the first connecting pattern 221b and the absorption axis are parallel or substantially parallel at one position (or one area) of the flat area FA, the third angle may be about 0 degrees and the fourth angle may be greater than about 0 degrees and less than about 45 degrees.

The angle between the first connecting pattern 221b in the flat area FA and the bending axes Ax1 and Ax2 may be greater than the angle between the first connecting pattern 221b in the bent area BA and the bending axes Ax1 and Ax2.

The fourth angle may have a different value varying according to the radius of curvature of the position of the touch sensor where the first connecting pattern 221b is located. The fourth angle may have two or more different values.

The display device according to embodiments of the present invention may maintain electrical signal transmission in the touch sensor despite cracks occurring in the touch sensor due to bending.

While the present invention has been particularly shown and described with reference to exemplary embodiments thereof, it will be understood by those of skill in the art that various changes and modifications may be made without departing from the spirit and scope of the present disclosure as set forth in the following claims and their equivalents.

The technical scope of the present invention should not be limited to the contents described in the detailed description of the specification but should be defined by the claims and their equivalents.

What is claimed is:

1. A touch sensor comprising:
    a substrate having a flat area and a bent area bent from the flat area;
    a plurality of first sensing electrodes on the substrate and arranged in a first direction, the first sensing electrodes comprising a plurality of first sensing patterns arranged in the first direction and a plurality of first connecting patterns respectively connecting adjacent ones of the first sensing patterns to each other, the first connecting patterns being arranged at an angle with respect to the first direction, the first sensing patterns and the first connecting patterns being on a same layer and comprising a same material; and
    a plurality of second sensing electrodes on the substrate and arranged in a second direction crossing the first direction, the second sensing electrodes comprising a plurality of second sensing patterns arranged in the second direction,
    wherein a first angle between a first one of the first connecting patterns in the flat area and the first direction is different from a second angle between a second one of the first connecting patterns in the bent area and the first direction.

2. The touch sensor of claim 1, wherein the second sensing electrodes are on the same layer and comprise the same material as the first sensing patterns and the first connecting patterns.

3. The touch sensor of claim 1, wherein the first angle and the second angle are acute angles, and the first angle is less than the second angle.

4. The touch sensor of claim 3, wherein the first angle is 45 degrees, and the second angle is greater than 45 degrees and less than 90 degrees.

5. The touch sensor of claim 1, wherein the first angle and the second angle are obtuse angles, and the first angle is greater than the second angle.

6. The touch sensor of claim 5, wherein the first angle is 135 degrees, and the second angle is greater than 90 degrees and less than 135 degrees.

7. A display device comprising:
a display panel having a flat area and a bent area bent from the flat area; and
a touch sensor on the display panel and having a shape corresponding to the display panel, the touch sensor comprising:
a plurality of first sensing electrodes arranged in a first direction, the first sensing electrodes comprising a plurality of first sensing patterns arranged in the first direction and a plurality of first connecting patterns respectively connecting adjacent ones of the first sensing patterns to each other, the first connecting patterns being arranged at an angle with respect to the first direction, the first sensing patterns and the first connecting patterns being on a same layer and comprising a same material; and
a plurality of second sensing electrodes arranged in a second direction crossing the first direction, the second sensing electrodes comprising a plurality of second sensing patterns arranged in the second direction,
wherein a first angle between a first one of the first connecting patterns in the flat area and the first direction is different from a second angle between a second one of the first connecting patterns in the bent area and the first direction.

8. The display device of claim 7, wherein the second sensing electrodes are on the same layer and comprise the same material as the first sensing patterns and the first connecting patterns.

9. The display device of claim 7, wherein the first angle and the second angle are acute angles, and the first angle is less than the second angle.

10. The display device of claim 9, wherein the first angle is 45 degrees, and the second angle is greater than 45 degrees and less than 90 degrees.

11. The display device of claim 7, wherein the first angle and the second angle are obtuse angles, and the first angle is greater than the second angle.

12. The display device of claim 11, wherein the first angle is 135 degrees, and the second angle is greater than 90 degrees and less than 135 degrees.

13. The display device of claim 7, further comprising a polarizing layer on the touch sensor, the polarizing layer having an absorption axis and a transmission axis perpendicular to the absorption axis.

14. The display device of claim 13, wherein the absorption axis and the first connecting patterns are parallel to each other in the flat area.

15. The display device of claim 7, wherein the second angle varies according to a radius of curvature of a position where the respective one of the first connecting patterns is arranged.

16. A display device comprising:
a display panel having a flat area and a bent area bent from the flat area about a bending axis;
a touch sensor on the display panel; and
a polarizing layer on the touch sensor, the polarizing layer having an absorption axis and a transmission axis perpendicular to the absorption axis,
wherein the touch sensor comprises:
a plurality of first sensing electrodes arranged in a first direction, the first sensing electrodes comprising a plurality of first sensing patterns arranged in the first direction and a plurality of first connecting patterns respectively connecting adjacent ones of the first sensing patterns to each other; and
a plurality of second sensing electrodes arranged in a second direction crossing the first direction, the second sensing electrodes comprising a plurality of second sensing patterns arranged in the second direction, and
wherein a first angle between a first one of the first connecting patterns in the flat area and the absorption axis is 0° and is different from a second angle between a second one of the first connecting patterns in the bent area and the absorption axis.

17. The display device of claim 16, wherein the first sensing patterns, the first connecting patterns, and the second sensing electrodes are on a same layer and comprise a same material.

18. The display device of claim 16, wherein the second angle is less than 90 degrees, and the first angle is less than the second angle.

19. The display device of claim 18, wherein the second angle is greater than 0 degrees and less than 45 degrees.

20. The display device of claim 16, wherein an angle between the first one of the first connecting patterns in the flat area and the bending axis is greater than an angle between the second one of the first connecting patterns in the bent area and the bending axis.

21. The display device of claim 16, wherein the second angle varies according to a radius of curvature of a position where the respective one of the first connecting patterns is arranged.

* * * * *